US006517958B1

(12) United States Patent
Sellinger et al.

(10) Patent No.: US 6,517,958 B1
(45) Date of Patent: Feb. 11, 2003

(54) ORGANIC-INORGANIC HYBRID LIGHT EMITTING DEVICES (HLED)

(75) Inventors: Alan Sellinger, Palo Alto, CA (US); Richard M. Laine, Ann Arbor, MI (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/616,561

(22) Filed: Jul. 14, 2000

(51) Int. Cl.$^7$ .............................. B32B 9/00; H05B 33/00
(52) U.S. Cl. .................. 428/690; 428/917; 252/301.35; 257/88; 313/503; 313/504; 313/506
(58) Field of Search ................................ 428/690, 917; 252/301.35; 257/88; 313/503, 504, 506

(56) References Cited

U.S. PATENT DOCUMENTS

| | | | | |
|---|---|---|---|---|
| 5,635,249 A | * | 6/1997 | Haluska et al. | 427/387 |
| 5,665,845 A | * | 9/1997 | Allman | 528/8 |
| 5,731,117 A | * | 3/1998 | Ferrar et al. | 430/66 |
| 6,184,304 B1 | * | 2/2001 | Pernisz | 525/326.5 |
| 6,214,937 B1 | * | 4/2001 | Kennedy et al. | 525/100 |
| 6,284,435 B1 | * | 9/2001 | Cao | 430/319 |

OTHER PUBLICATIONS

Bailey, Nigel, "The Future of Organic Light–Emitting Devices", Information Display 3/00, pp. 12–16.

\* cited by examiner

Primary Examiner—Bruce H. Hess
Assistant Examiner—Dawn Garrett
(74) Attorney, Agent, or Firm—Fitzpatrick, Cella, Harper & Scinto

(57) ABSTRACT

Organic-inorganic HLED materials based on silsesquioxane architectures are disclosed. These silsesquioxane compounds incorporate at least one, and preferably multiple, functional moiety substituents selected from hole transport, electron transport, and emissive material moieties and combinations thereof. The hybrid materials have OLED properties, e.g. luminescence efficiency, brilliance, turn-on voltage, longevity, etc. HLED devices fabricated with the polyhedral silsesquioxane HLED materials are disclosed. The organic-inorganic HLED devices can include multiple layers of organic-inorganic luminescent material having different functional moiety substituents to balance charge transport and emissive properties. HLED devices can be fabricated with a single layer of the organic-inorganic hybrid luminescent material that contains hole transport, electron transport, and emissive material substituent moieties on a polyhedral silsesquioxane structure.

37 Claims, 3 Drawing Sheets

ORGANIC-INORGANIC HYBRID LIGHT EMITTING DEVICES (HLED)

TECHNICAL FIELD

The present invention relates to compositions used to fabricate light emitting devices, more specifically, the present invention is drawn to organic-inorganic hybrid light emitting devices (HLED) fabricating with light emitting compositions in which hole transport, electron transport, and emissive compounds are covalently linked to polyhedral silsesquioxanes.

BACKGROUND ART

Flat panel displays based on organic light emitting devices (OLEDs) have been studied extensively by hundreds of industrial and academic institutions worldwide for the last decade. OLEDs offer exceptional potential for thinner, more energy efficient displays with equal or better resolution and brightness compared to the current liquid crystal display (LCD) technology. OLEDs also offer high switching speeds, excellent viewing angles (>160°), red, green and blue (RGB) color selection possibilities, and because no backlighting is necessary, it may be possible to fabricate devices on flexible substrates. However, despite the enormous research and development effort on OLEDs, there is presently only one commercially available product using this technology. One of the apparent problems for this is the need for the development novel efficient materials to satisfy the electronic device requirements.

The scientific basis for OLEDs relies on an organic material's ability to emit light when subjected to electrical stimuli. In this process, electrons and holes are injected into organic materials from conducting electrodes and diffuse through a thin organic film to form electron-hole pairs or excitons within a highly conjugated organic molecule or polymer layer. The excitons then recombine creating an excited state within the organic molecule. The excited state can then undergo radiative decay emitting a photon. Depending on the organic polymer/molecule and its substituents, the wavelength of light emitted can be any color and even multicolored, e.g. red, green, blue or combinations thereof.

For optimal operation, it is important that the rate at which the holes and electrons diffuse into this emitting layer be similar, and preferably matched. Hence, numerous efforts have been made to optimize transport of both holes and electrons to the emitting layer and also to prevent trapping of holes or electrons that leads to destructive effects within the devices. Most recently, efforts have been made to incorporate organic molecules or polymers that promote movement of holes or electrons within the OLED device. Still more recently, efforts have been made to incorporate organic molecules or monomer units in polymeric systems such that one organic unit promotes hole or electron conduction and a second organic unit promotes emission. Such electronic tuning is designed to minimize the transport distances and maximize the hole/electron injection balance, thereby enhancing the potential for radiative decay rather than non-radiative decay. Considerable work in this area remains.

Early examples of organic electroluminescence were reported by Pope et al. in 1963 [Pope, M.; Kallmann, H.; Magnante, P. *J. Chem. Phys.* 1962, 38, 2042] who demonstrated blue light emission from single crystal anthracene using very high voltages, ≈400 V.

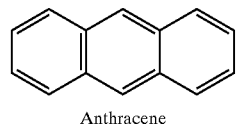

Anthracene

Advances on OLED processing over the next two decades were limited to forming thin, light emitting films of organic compounds by vacuum deposition techniques, [Vincett, P. S.; Barlow, W. A.; Hann, R. A.; Roberts, G. G. *Thin Solid Films* 1982, 94, 476] and lowering driving voltages to <30 V, however these single-layer devices suffered from both poor lifetimes and luminescence efficiencies. In 1987, Tang and Van Slyke [Tang, C. W.; Van Slyke, S. A. *Appl. Phys. Lett.* 1987, 51, 913] at Eastman Kodak discovered how to make two-layer electroluminescent devices. As shown in FIG. 1, the OLED device 10 was prepared by sandwiching organic hole transport (HT) material 12 and emissive (EM) material 14 between an indium-tin-oxide (ITO) anode 16 and magnesium/silver alloy cathode 18 layers. A conventional electric potential source 20 was connected to the cathode 18 and anode 16. A glass substrate 22 allowed light emission as shown by Arrow 24. The hole transport (HT) and emissive (EM) materials used by Tang and Van Slyke are shown below.

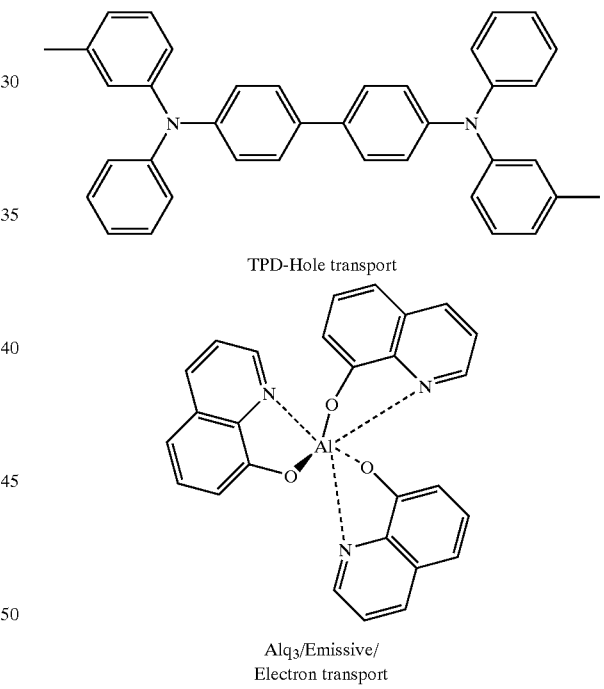

TPD-Hole transport $Alq_3$/Emissive/
Electron transport

Materials Used by Tang and Van Slyke

The key to device performance was the layered architecture sequence: cathode/emissive-electron transport/hole transport/anode. These devices demonstrated brightness, efficiencies, and lifetimes far exceeding anything reported at that time. The materials shown in FIG. 1 were deposited onto indium tin oxide (ITO) coated glass by a vacuum sublimation process to a thickness of ≈25 nm.

In 1990 Burroughs et al. [Burroughs, J. H.; Bradley, D. D. C.; Brown, A. R.; Marks, R. N.; Mackay, K.; Friend, R. H.; Burn, P. L. *Nature* 1990, 347, 539] developed polymeric OLED devices or PLEDs. In 1992, Braun et al. [Braun, D.;

Gutafson, D.; McBranch, D.; Heeger, A., J. *J. Appl. Phys.*, 1992, 72, 546] discovered that poly(p-phenylenevinylene) (PPV), and its derivatives will electroluminesce both green and red light when confined between ITO and aluminum electrodes.

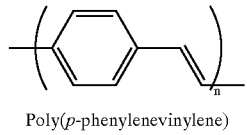

Poly(*p*-phenylenevinylene)

This work was important because PPV polymers can be deposited by a spin coating process that is more cost effective than vacuum sublimation. Spin coating also facilitates coating larger areas. As a result of these pioneering examples, hundreds of OLED and PLED based papers have been reported by research groups around the world using the following two common materials deposition approaches:

1. Vacuum sublimation of molecular species; and
2. Dip, spin, and spray coating or printing of oligomeric or polymeric materials.

Each method has advantages and disadvantages as outlined below.

Vacuum sublimation works well only with relatively low molecular weight (MW) compounds (<300 g/mol). Such compounds must be purified by sublimation or column chromatography to purities >99.99% prior to deposition to obtain superior light emitting efficiencies and device lifetimes. Vacuum sublimation allows for multi-layer configurations and very precise control of film thickness, both of which are advantageous in OLED processing. Drawbacks to vacuum sublimation are that it requires very costly equipment and it is limited to deposition on surface areas that are much smaller than surfaces that can be coated using spin coating. Additionally, device performance is adversely affected by the tendency of some sublimed compounds to crystallize with time. To prevent premature crystallization, compounds are currently being designed with high glass transition temperatures (Tgs) and substituents that minimize or prevent crystallization.

Dip coating, spin coating, spray coating, and printing techniques are generally applicable to the deposition of oligomeric and polymeric materials. It permits precise film thickness control, large area coverage and is relatively inexpensive compared to vacuum sublimation. Multi-layer configurations are only possible if the deposited layers are designed with curable functional groups for subsequent cross-linking, or with differing solubilities to prevent re-dissolution during additional coatings. For example, current OLED polymer technology uses a water soluble pre-polymer PPV (shown below), that is thermally cured after deposition rendering it insoluble. [Li, X. C.; Moratti, S. C. *Semiconducting Polymers as Light-Emitting Materials*; Wise, D. L., Wnek, G. E., Trantolo, D. J., Cooper, T. M. and Gresser, J. D., Ed., 1998].

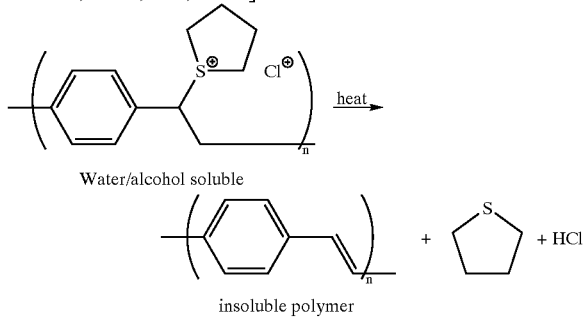

Process for Converting Soluble PPV to Insoluble PPV

Initial luminescent properties for OLEDs based on polymers were often inferior to their molecular counterparts. This was partly due to the difficulty in obtaining high purity material (99.99%) (polydispersity, endgroups, residual solvents and byproducts such as HCl, catalysts, etc.) necessary for efficient devices. However recent studies have shown that carefully purified polymers have similar or even better resultant properties to their molecular counterparts.

Some important parameters to consider when designing novel materials for practical devices include:

1) Methods of deposition—Spin, spray, dip coating and ink (bubble) jet printing are typically more cost effective than vacuum sublimation. Therefore, the luminescent material is preferably usable with spraying, spin coating, dip coating, and/or printing methods.

2) Materials molecular architecture—materials should be designed to prevent or minimize crystallization and/or aggregation that are known to yield inferior device properties.

3) Color tuning and color purity—Luminescent materials should be designed to provide red, green, and blue (RGB) electroluminescence for full color devices. They should be readily purified to ≧99.99% purity.

4) Increase in device efficiency, brightness, and lifetime—To provide devices for commercial application, materials should provide >2% external quantum efficiency (2 photons emitted per 100 injected electrons), >500 $cd/m^2$ operating at <5 V, and luminescence half-lives >10,000 hours (roughly equivalent to 10 h/day, 6 days/week for 3 years).

5) Construction of efficient device architectures—The most commonly reported design is shown in FIG. 1. Cathodes are generally prepared by vacuum deposition of Ag/Mg, Ca, or Al. Typically cathodes with lower work functions provide better initial device performance—i.e. Ca<Al/Li/Ag/Mg<Al. However, as Ca, Ag, and Mg are more susceptible to oxidation, Al is generally the cathode material of choice. The anodes are typically commercially available ITO coated glass. Studies show that final device performance is directly correlated to the ITO surface properties; thus, extreme care should be taken when selecting the ITO anode. Alternatively, poly(aniline) (PANI), and poly(2,3-ethylenedioxy)thiophene (PEDOT) have been used as anode material on both ITO deposited on glass and flexible Mylar® substrates.

From the foregoing, it will be appreciated that there is a need in the art for OLED materials that can be easily and highly purified, that have high Tgs and little tendency to crystallize or aggregate, that can be processed by spin coating, dip coating, or printing methods, that are exceptionally resistant to thermal, oxidative, hydrolytic and electrolytic degradation, that can be readily modified to permit tailoring of properties, e.g. stability, electroluminescent efficiencies, solubility, etc., that have low turn-on voltages and relative ease in color tuning.

DISCLOSURE OF THE INVENTION

The present invention includes a method of synthesizing and characterizing organic-inorganic HLED materials based on silsesquioxane architectures. These hybrid materials have the potential to combine the advantages of both molecular and polymer approaches to OLED applications. The silsesquioxane compounds incorporate at least one, and preferably multiple, functional moiety substituents within a single compound. The functional substituents are preferably selected from hole transport (HT), electron transport (ET), and emissive material (EM) moieties and combinations thereof. This offers considerable potential to optimize OLED properties, e.g. luminescence efficiency, brilliance, turn-on voltage, longevity, high density of HT, ET, and EM moieties, etc.

The organic-inorganic HLED silsesquioxane material has the general formula $(RSiO_{1.5})_n$ wherein n typically ranges from 6 to 12 for discrete cage structures, but n can be much larger (up to about 100) in extended polymeric silsesquioxane structures, and R is selected from a plethora of functional groups including hole transport, electron transport, and emissive materials. The hybrids may be synthesized from a series of core polyhedral silsesquioxane intermediates having a variety of reactive substituent groups capable of reacting with functional groups having HT, ET, or EM properties. Examples of typical reactive substituent groups of silsesquioxane intermediates include, but are not limited to, hydrogen, vinyl, phenyl, substituted phenyl, stilbenyl, and substituted stilbenyl, where the phenyl substituents include, halo, amino, hydroxyl, vinyl, unsaturated alkyl, haloalkyl, silyl, etc. Some hybrids may also be synthesized using a direct sol-gel synthesis with $R-Si(OCH_2CH_3)_3$ as a starting material.

One organic-inorganic HLED material having an octahedral silsesquioxane structure has the following general structure:

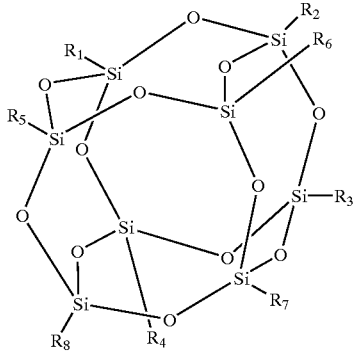

wherein $R_1$, $R_2$, $R_3$, $R_4$, $R_5$, $R_6$, $R_7$, and $R_8$ are selected from hole transport moieties, electron transport moieties, emissive material moieties, and curable groups including, but not limited to, epoxy, methacrylate, stryl, vinyl, propargyl and combinations thereof. The hybrid material preferably includes at least one HT, ET, or EM moiety. The curable groups are included to facilitate fabrication of multilayer devices, but would not necessarily be needed in a single layer device.

The present invention includes organic-inorganic HLED devices fabricated with an HLED material described above. Such devices typically include an anode containing a high work function metal, metal alloy, or metal oxide, a cathode containing a low work function metal or metal alloy, and a layer of the organic-inorganic luminescent material based upon the silsesquioxane structures described above, physically and thus electrically connected to the anode and cathode. The organic-inorganic HLED devices are preferably fabricated with a transparent substrate such as glass or clear plastic. The anode is preferably selected from gold, silver, copper, indium-tin oxide (ITO), fluorine-tin oxide (FTO), or other transparent conducting oxide or polymeric materials. Below about 50 nm, gold, silver, and copper layers are semi-transparent rendering them useful anode materials. The cathode is selected from calcium, magnesium, lithium, sodium, aluminum, and alloys thereof. The cathode may also be selected from mixtures of calcium, magnesium, lithium, sodium, and aluminum with halogen salts of group IA metals (Li, Na, K, Rb, Cs). For example, a commercially available Al/Li alloy (98.5% Al/1.5% Li) Al is relatively stable in air and has a work function similar to Ca. Similarly, LiF, CsF, and other salts can lower the work function when deposited at the Al/organic interface.

The organic-inorganic HLED device can include multiple layers of organic-inorganic luminescent materials. Each layer can be based upon luminescent material having different functional moiety substituents selected from hole transport, electron transport, and emissive material moieties. For instance, the HLED device may include a layer having hole transport substituents, a layer having electron transport substituents with the hole and/or electron transport layer(s) also serving as the emissive component. Other substituents can be included to provide desired functional or physical characteristics, such as enhanced hydrophobicity, adhesive character, and dyes for color tuning to the HLED material. The HLED materials can also be designed to include multiple properties, such as balanced electron and hole transport as well as emissive properties.

The organic-inorganic HLED device can be fabricated with a single layer of the organic-inorganic luminescent material that contains hole transport, electron transport, and emissive material substituent moieties on a silsesquioxane structure. HLED devices can also be fabricated with multiple layers containing emissive, hole transport, and electron transport layers balanced to provide the desired luminescent properties.

DETAILED DESCRIPTION OF THE PREFERRED EMBODIMENTS

Figure 1:
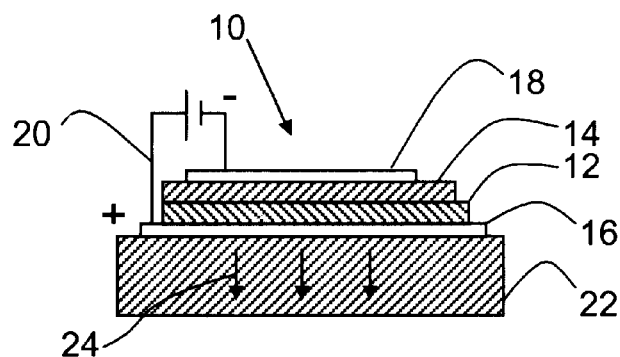
FIG. 1 is a schematic illustration of a typical OLED device configuration.

The present invention is directed to new organic-inorganic HLED materials in which organic components are covalently linked to silsesquioxane inorganic (or organometallic) units. The organic-inorganic HLED silsesquioxane material has the general formula $(RSiO_{1.5})_n$ wherein n typically ranges from 6 to 12, but can range as high as 100, and R is selected from functional groups including hole transport (HT), electron transport (ET), and emissive (EM) materials. The hybrids may be synthesized from a core polyhedral silsesquioxane intermediate having reactive substituent groups capable of reacting with functional groups having HT, ET, or EM properties. Some hybrids may also be synthesized using a direct sol-gel synthesis with $R-Si(OCH_2CH_3)_3$ as a starting material.

Presently preferred embodiments within the scope of the present invention rely on polyhedral octameric or cubic silsesquioxanes. The silsesquioxanes resemble skeletal frameworks found in crystalline forms of silica and particular zeolites. Bartsch, M.; Bornhauser, P.; Calzaferri, G. *J. Phys. Chem.* 1994, 98, 2817. Such structures can represent building blocks from which subsequent chemistry is used to prepare hybrids with the desired LED properties as described above. These structures are easily prepared in yields ranging from >90% to 30%, from low cost starting materials. Their rigid framework offers many appealing properties that have been exploited by Feher et al. [Feher, F.

J.; Newman, D. A.; Walzer, J. F., *J. Am. Chem. Soc.*, 1989, 111, 1741] to develop unique models of silica surfaces, by Calzaferri et al. [Bartsch et al., supra] as models of zeolites, by Klemperer et al. [Agaskar, P. A.; Day, V. W.; Klemperer, W. G., *J. Am. Chem. Soc.*, 1987, 109, 5545] as unique sol-gel precursors, and by other groups for diverse applications. Access to these materials, especially the $(HSiO_{1.5})_n$ series, is from extensive efforts by Agaskar [Agaskar, P. A., *J. Am. Chem. Soc.*, 1989, 111, 6858; Agaskar, P. A., *Inorg. Chem.*, 1992, 30, 2708; Agaskar, P. A., *Colloids and Surfaces*, 1992, 63, 131; and Agaskar, P. A., *Synth. React. Inorg. Met.-Org. Chem.*, 1992, 20, 483]. Routes to the related $[(R(CH_3)_2SiO)SiO_{1.5}]_8$ and $[(R(CH_3)_2SiO)SiO_{1.5}]_{6/10}$ cubes were reported by Hasegawa et al. [Hasegawa, I.; Motojima, S., *J. Organomet. Chem.*, 1992, 373 and Hasegawa, I., *J. of Sol-Gel Sci. and Tech.*, 1994, 2, 127] and German Patent No. DE 3837397, respectively.

Furthermore, functionalized cubic silsesquioxanes, where R=H, $OSi(CH_3)_2H$, $CH=CH_2$, epoxy, and methacrylate, allow for incorporation into organic matrices providing hybrids with well defined, discrete nano-structures and tailorable properties [Sellinger, A.; Laine, R. M.; Chu, V.; Viney, C., *J. Polymer Sci., Part A, Polymer Chemistry*, 1994, 32, 3069; Sellinger, A.; Laine, R. M., *Macromolecules*, 1996, 26; Sellinger, A.; Laine, R. M., *Chem. Mater.*, 1996, 8, 1592; and Laine, R. M.; Zhang, C., *J. Organomet. Chem.*, 1996, 521, 199].

Combining electroluminescent functional groups with silsesquioxanes offers many unique and advantageous properties. This approach is based on coupling known and novel OLED functional groups with well-defined electronic properties (i.e. electron transport, hole transport, or emissive properties) with silsesquioxanes as shown below.

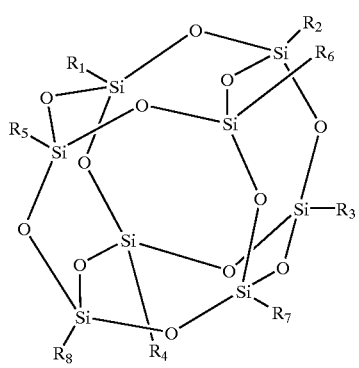

(1)

For example structure 1 wherein $R_1$, $R_2$, $R_3$, $R_4$, $R_5$, $R_6$, $R_7$, and $R_8$ are selected from hole transport, electron transport, emissive material, and curable moieties as described below. Examples of organic-inorganic HLED materials substituted with discrete hole transport, electron transport, and emissive moieties are illustrated below. Persons skilled in the art will appreciate that other HLED materials can be prepared having differentiating hole, electron transport, and emissive moieties.

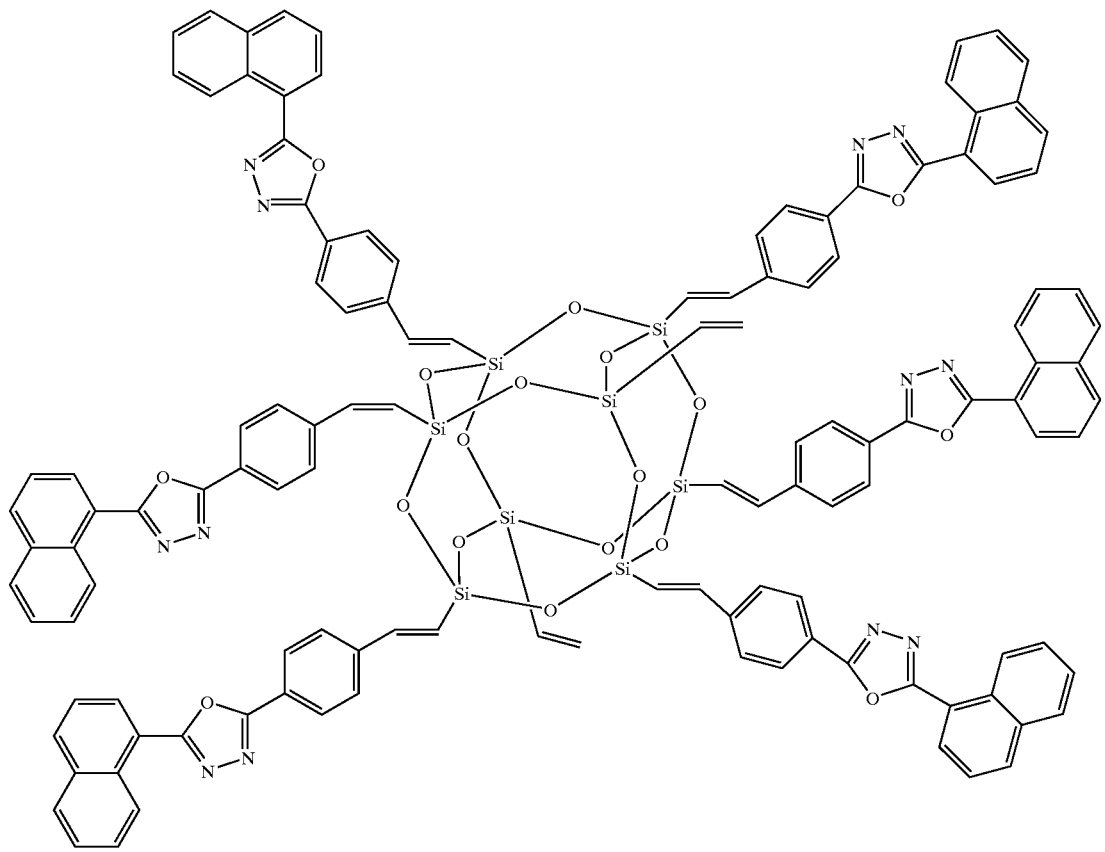

Electron Transport HLED (2A)

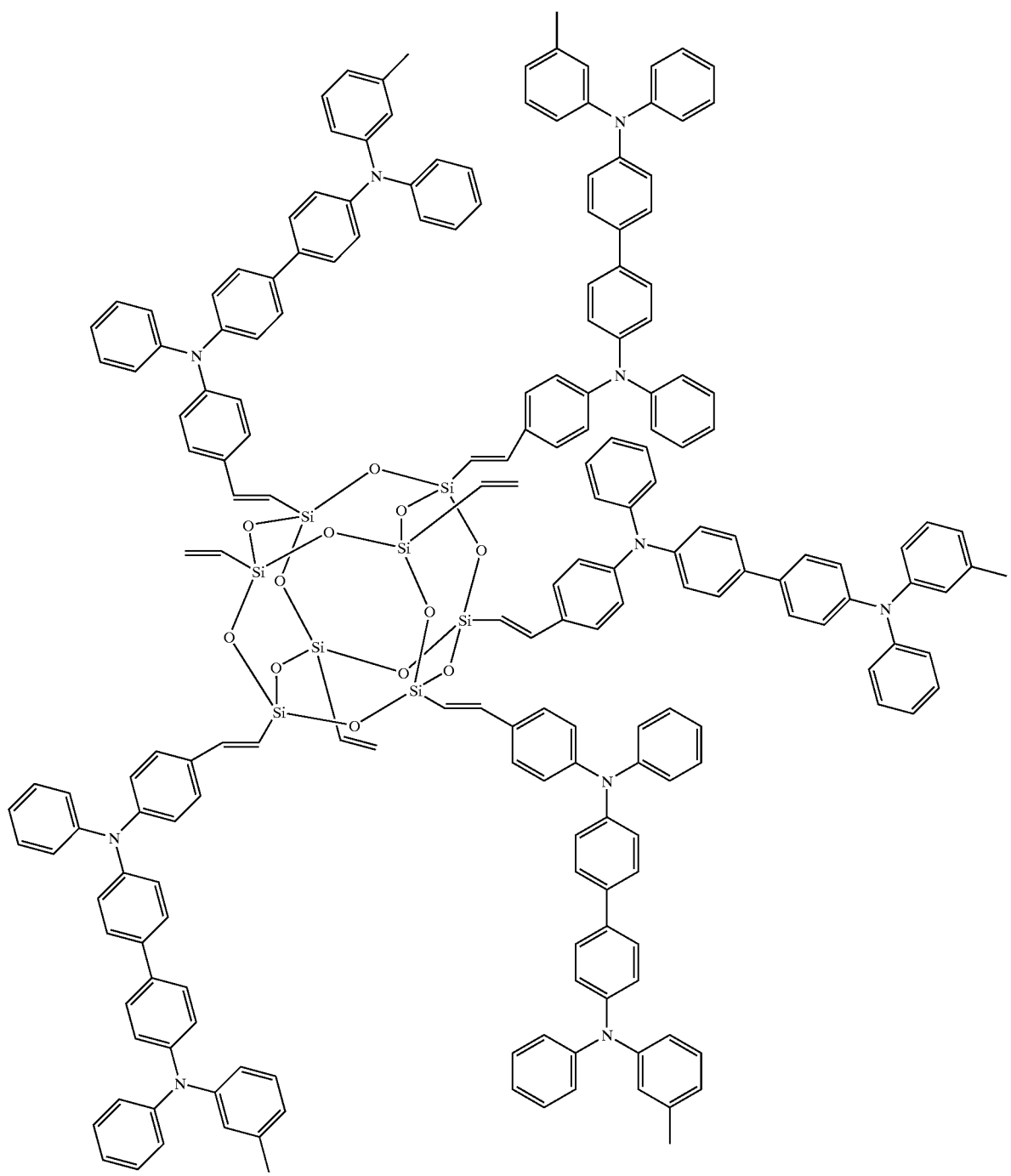
Hole Transport HLED (2B)

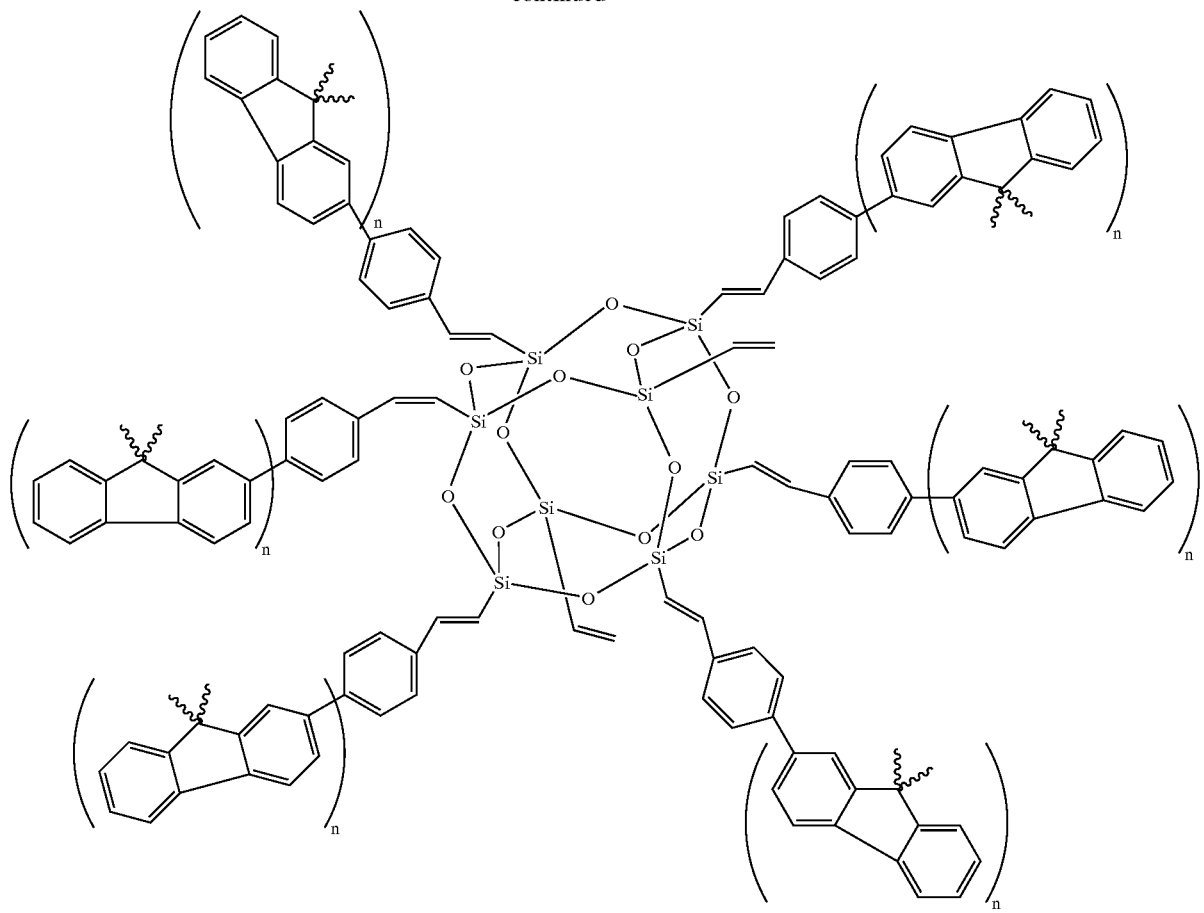

Emissive HLED (2C)

There are several advantages of these HLED materials over molecular and polymer approaches currently described in the literature. For instance, these HLED materials may have molecular weights exceeding 3000 g/mol and thus are candidates for spray, dip and/or spin coating, or printing processes rather than vacuum sublimation, thereby providing a more cost effective application route. Other advantages, described in the following sections, include high temperature stability, ease of purification, high-density of HT, ET and EM moieties, and prevention of crystallization and aggregate formation to name a few.

As mentioned above, the HLED materials may be synthesized from polyhedral silsesquioxane intermediates having reactive substituent groups capable of reacting with functional groups having HT, ET, or EM properties. Several possible reactions that can be used for this purpose are illustrated generally below. Such reactions include, but are not limited to, high yield metal catalyzed hydrosilation, Heck, Suzuki, and Buchwald-Hartwig amination chemistry. In each reaction, it will be appreciated that one reactant will include the silsesquioxane intermediate and the other reactant will include the desired functional group.

Platinum catalyzed hydrosilation of silicon hydrides with double and triple bonds is shown below:

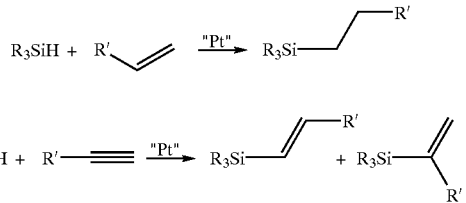

Palladium catalyzed Heck reaction of vinyl groups with activated aromatic compounds is shown below, wherein X is Cl, Br, I, triflate, or other leaving group:

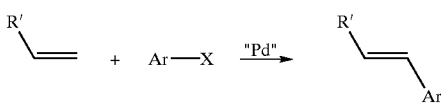

Palladium catalyzed Suzuki reaction of a halophenyl with activated aromatic compounds is shown below, wherein X is Cl, Br, I, triflate, or other leaving group:

Palladium catalyzed Buchwald-Hartwig amination reaction of activated aromatic compounds with aromatic amines is shown below:

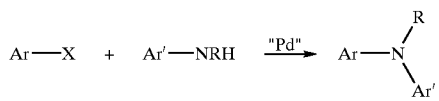

Some hybrids may be synthesized using a direct sol-gel synthesis with R—Si(OCH$_2$CH$_3$)$_3$ as a starting material, as shown below:

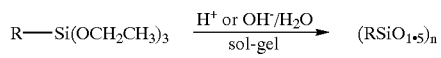

where R is a hole transport moiety, electron transport moiety, emissive material moiety, or curable groups. Because some ET groups may be sensitive to the acid or base reaction conditions used in sol-gel processing, the foregoing process may not be suitable for preparing ET functionalized silsesquioxane materials thus the former reaction methods are preferred.

This chemistry is straightforward, versatile, and may provide photo and/or thermally curable materials for multiple coating capabilities. The remaining double bond from the reaction of Si—H with triple bonds allows for each layer to be cured into an insoluble network immediately following deposition. For example, one can choose to: 1) synthesize a cube containing HT, ET, and EM moieties in a single cube (such as compound (3)) for a single step deposition process (FIG. 2A) or 2) synthesize individual cubes containing only HT, ET, or EM moieties (such as compounds (2A)–(2C)) which can be deposited in successive layers (FIG. 2B), or 3) any combination of these possibilities.

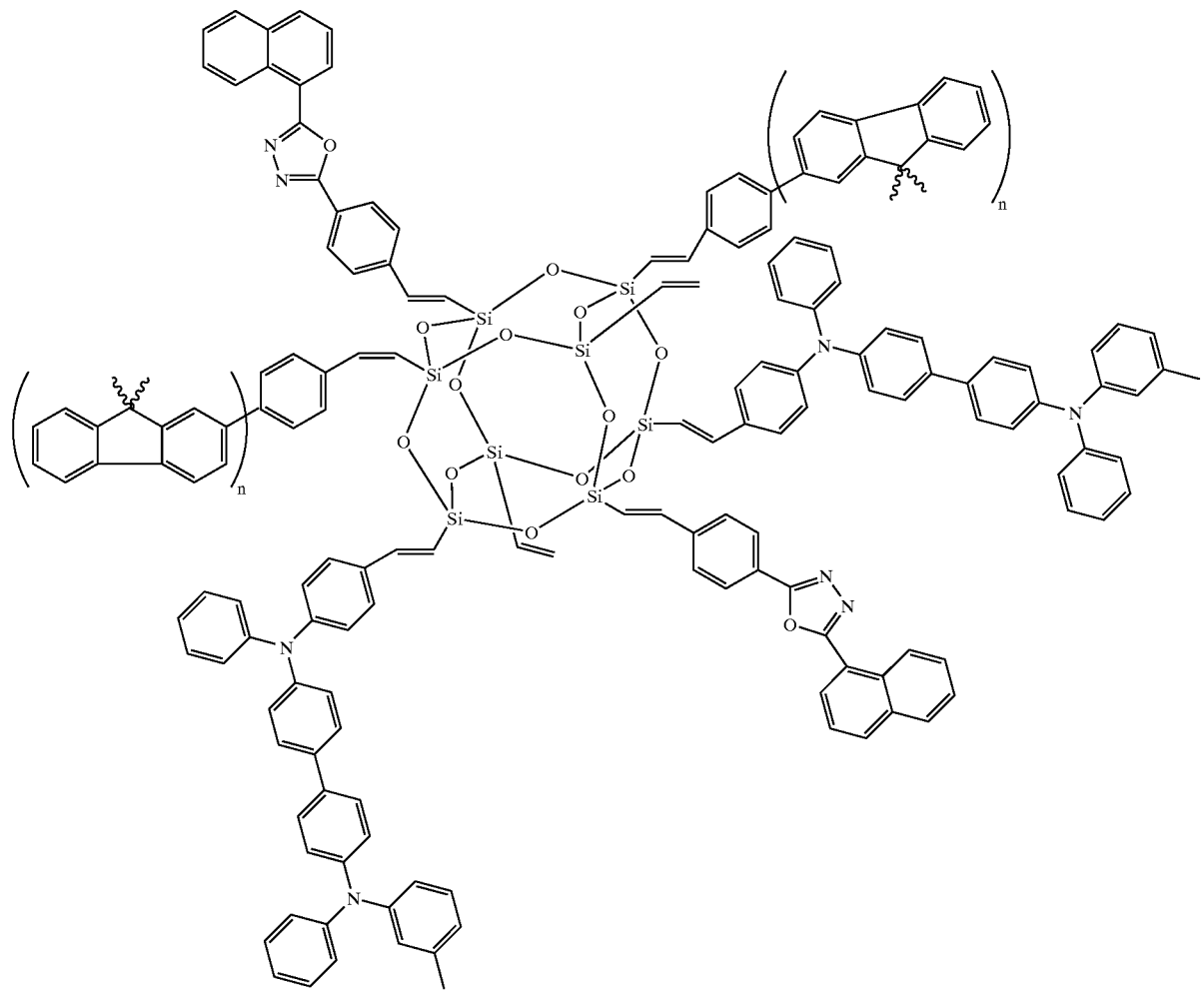

(3)

Figure 2A:
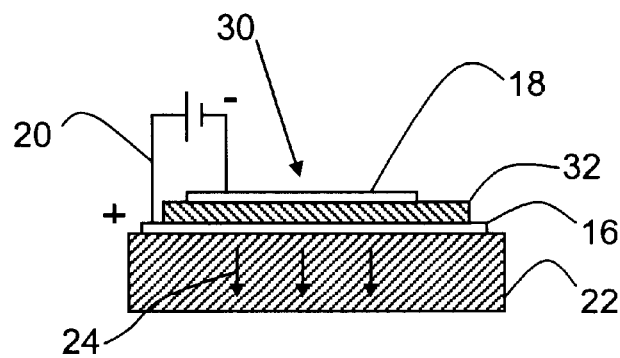
FIG. 2A is schematic illustration of a HLED device within the scope of the present invention containing a single layer of HLED material having integrated hole transport, electron transport, and emissive material properties.
Figure 2B:
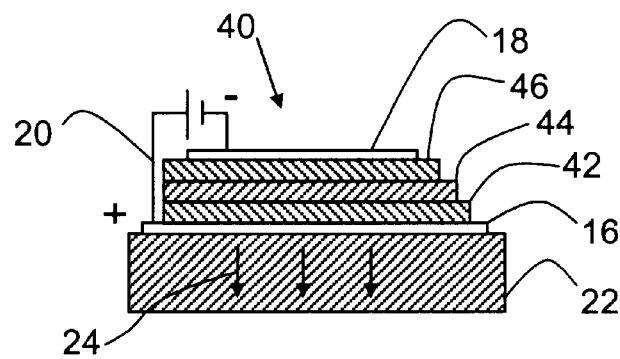
FIG. 2B is a schematic illustration of a HLED device within the scope of the present invention containing separate electron transport, emissive, and hole transport layers of HLED material.

FIG. 2A shows a HLED device 30 containing a single layer of HLED material 32 having integrated hole transport, electron transport, and emissive material properties. Using such a HLED material permits the device to be fabricated in a single step deposition process. Persons skilled in the art will appreciate that other HLED materials can be prepared having a combination emissive/hole transport moieties, emissive/electron transport moieties, or hole/electron transport moieties. FIG. 2B is a schematic illustration of a HLED device 40 within the scope of the present invention containing separate hole transport 42, emissive 44, and electron transport 46 layers of HLED material.

The hybrids described in this invention may be purified by traditional polymer methods such as precipitation into a non-solvent. However, in contrast to polymers, hybrids based on silsesquioxanes may be purified by flash column chromatography, to provide materials with ≧99.99% purity that is ideal for LED materials. As the cube materials can contain up to 40 wt. % silica, their thermal, hydrolytic and mechanical (e.g. abrasion resistance) properties are anticipated to be better than traditional OLED materials. The resulting materials are amorphous, transparent and thus have little tendency to crystallize over time. Furthermore, as the rigid rod HT, ET, and emissive moieties branch out from a three dimensional central core, little chance for alignment and aggregation exists thus minimizing the chance for eximer formation (charge traps) in devices. The high efficiency chemistry and resultant monodisperse spherical structures (sometimes referred to as dendrimers or starburst molecules) allows for precise control of functional groups (curing), processing parameters (viscosity), color tuning, electronic and optical properties, and materials morphology. HLEDs may be designed to be hydrophobic, as shown in compound (4), below, with fluoroalkyl groups, as adsorbed water is known to reduce OLED device lifetimes and efficiencies.

The illustrated compounds are given by way of example only. Persons skilled in the art will appreciate that other known and novel electron transport moieties can be used in the present invention, including but not limited to, organic compounds containing aromatic pyridines, quinolines, triazoles, oxadiazoles, dicyanoimidazoles, cyano aromatics, imino aromatics, and triazines or their combination.

Electron Transport Moieties

pyridines

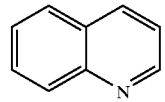

quinolines

triazoles

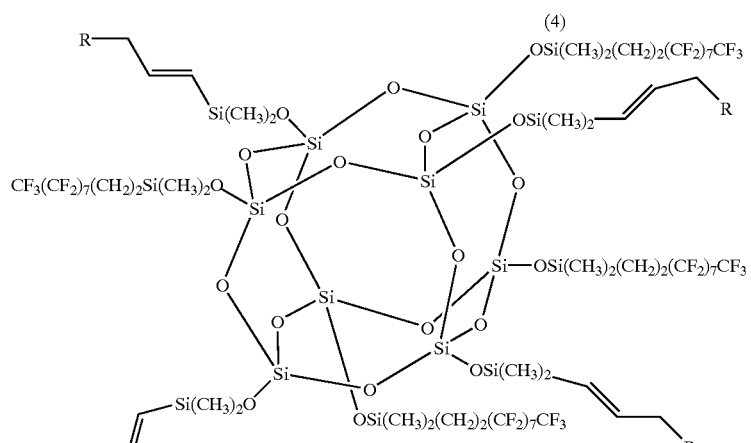

(4)

HLED compounds based on hydrido silsesquioxanes

The substituent R is preferably selected from hole transport, electron transport, and emissive material moieties. Although compound (4) is shown with four substituent R groups, it will be appreciated by persons having ordinary skill in the art that the type and number of substituent groups can be varied. In other words, the organic-inorganic HLED materials based upon the octahedral silsesquioxane structure can contain from 1 to 8 functional substituents, and the substituents can be the same or different.

The following are examples of typical electron transport moieties that can be used and/or chemically attached to the cubes (ET-HLED) within the scope of the present invention.

-continued

oxadiazoles

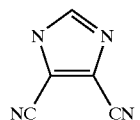

dicyanoimidazoles triazines

The following are examples of typical hole transport moieties that can be used and/or chemically attached to the cubes (HT-HLED) within the scope of the present invention. The illustrated compounds are given by way of example only. Persons skilled in the art will appreciate that other known and novel hole transport moieties can be used in the present invention, including, but are not limited to, organic compounds containing aromatic phosphines, aromatic amines, thiophenes (polythiophenes), silanes (polysilanes), and derivatives.

Hole Transport Moieties aromatic phosphenes

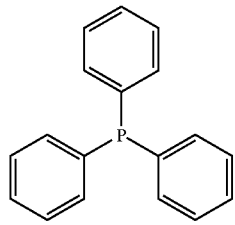

aromatic amines

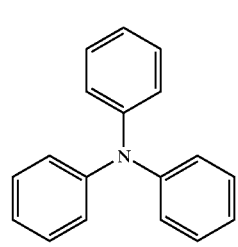

thiophenes

silanes

The following are examples of typical emissive material moiety substituents that can be used in the HLED materials within the scope of the present invention. The illustrated compounds are given by way of example only. Persons skilled in the art will appreciate that other known and novel emissive moieties can be used in the present invention.

Emissive Moieties poly(fluorenes)

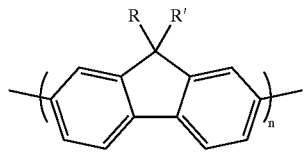

ploy(m- or p-phenylene)

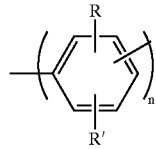

poly(phenylenevinylene)

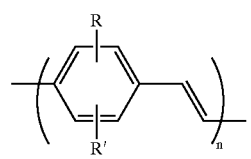

poly(phenyleneacetylenes)

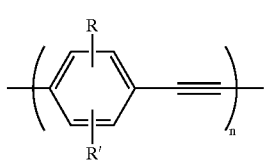

Where R and R'=H, C, O, N, S, Si, Ge, fluoroalkanes, flourosilylalkanes, etc., and n is selected to optimize emissive properties and will typically range from 1 to 100, more preferably from 1 to 20.

The compounds shown above are examples of materials that can be used to make HLEDs. They are meant only to illustrate HLED materials within the scope of the invention and are not meant to limit the invention to the illustrated compounds.

EXAMPLES

The following examples are given to illustrate various embodiments within the scope of the present invention. These are given by way of example only, and it is to be understood that the following examples are not comprehensive or exhaustive of the many embodiments within the scope of the present invention.

Example 1

Product from the reaction of octavinylsilsesquioxane with 2-(4-bromophenyl)-5-(1-naphthyl)-1,3,4-oxadiazole.

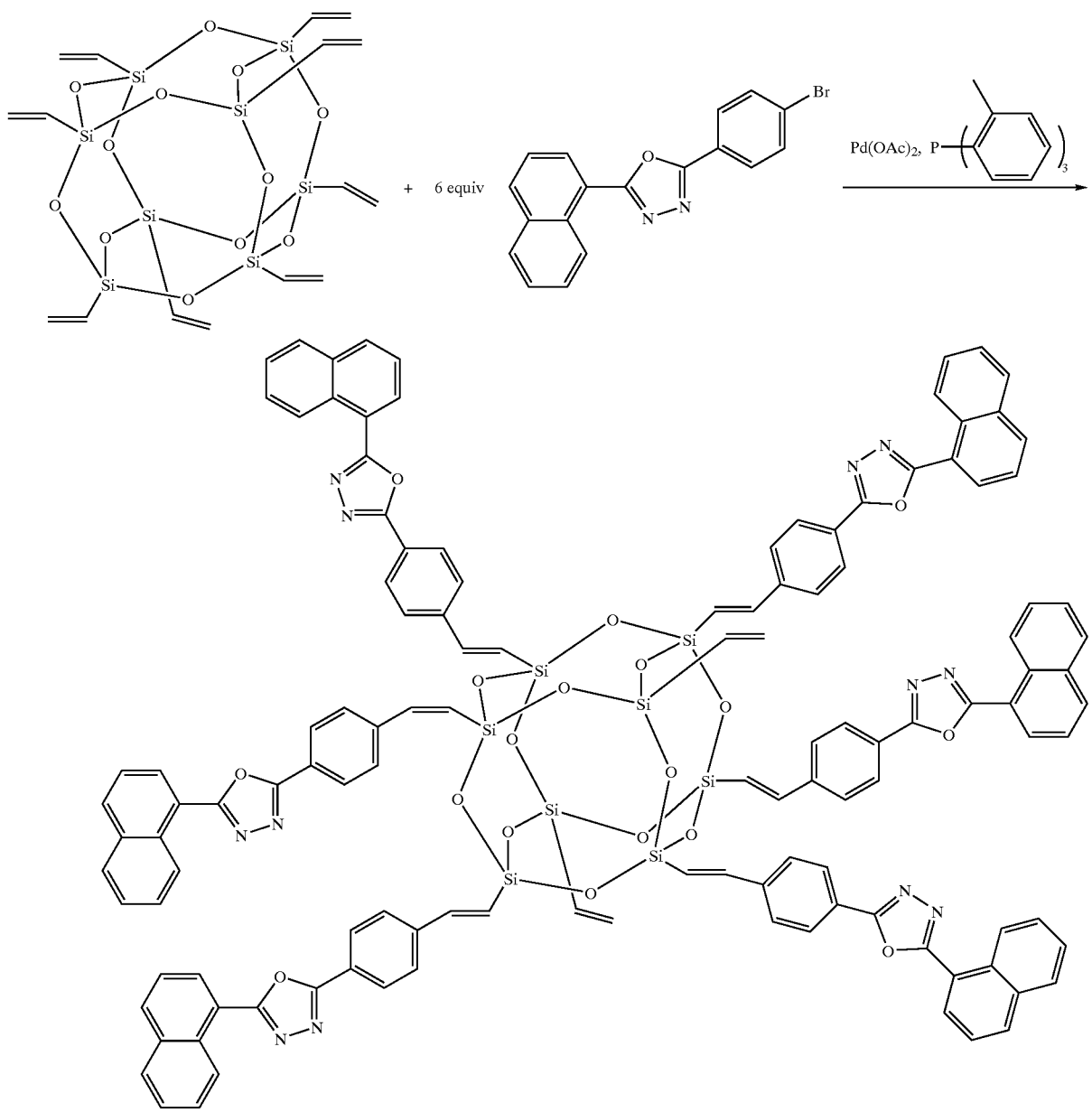

Octavinylsilsesquioxane (1 g, 1.57 mmol), 2-(4-bromophenyl)-5-(1-naphthyl)-1,3,4-oxadiazole (3.32 g, 9.46 mmol), palladium acetate (0.021 g, 0.095 mmol), and tris(o-tolyl)phosphine (0.072 g, 0.238 mmol) were added to a 25 mL schlenk flask equipped with stir bar, condenser, vacuum and argon gas source. The contents of the flask were evacuated and refilled with argon three times. Dry toluene (50 mL) and dry acetonitrile (10 mL) were added followed by triethylamine (1.45 mL, 10.4 mmol) and the solution was stirred for 48 hours at 100° C. at which point thin layer chromatography indicated reaction completion. The solution was cooled to room temperature and poured into dichloromethane (200 mL). 5% HCl (100 mL) was added and the organic layer was extracted three times followed by brine (100 mL) three times. The organic layer was separated and dried with sodium sulfate and the volume was reduced to provide a tan solid (90% yield). The sample can be purified by column chromatography using a hexane/ethyl acetate system of 95/5. Alternatively, the solution was poured into 300 mL methanol and the precipitate was obtained via filtration. The powder was redissolved in THF or dichloromethane, filtered through a 0.45 um teflon membrane (Pall), and the powder again precipitated into methanol and collected by filtration followed by drying. Palladium dibenzylideneacetone [$Pd_2(dba)_3$], tri-t-butylphosphine (1/1 molar ratio) and N,N-dicyclohexylmethylamine may be used in place of palladium acetate, tris(o-tolyl)phosphine and triethylamine respectively. The former reagents allow for more mild reaction conditions, i.e., room temperature rather than 100° C. and shorter reaction times (8 hrs). Size exclusion chromatography (SEC) revealed no starting material and a $M_n$=2270 g/mol (2252 g/mol actual), and polydispersity index (PDI) of 1.10. Proton NMR was consistent with the title material and differential scanning calorimetry (DSC) revealed a glass transition (Tg)=125° C.

Example 2

Product from the reaction of octavinylsilsesquioxane with 1-(m-tolyl-phenylamino)-1'-(p-bromophenyltolylamino)biphenyl.

This material was prepared using the procedure from Example 1 to give a yellow solid in 85% yield. Dilute solutions photoluminesce quite strongly in the presence of long wavelength light (around 360 nm) giving off a bright blue light. A solution photoluminescent spectral max of 488 nm was obtained using an excitation wavelength of 366 nm. The photoluminescence results for both solution and thin

Figure 3:
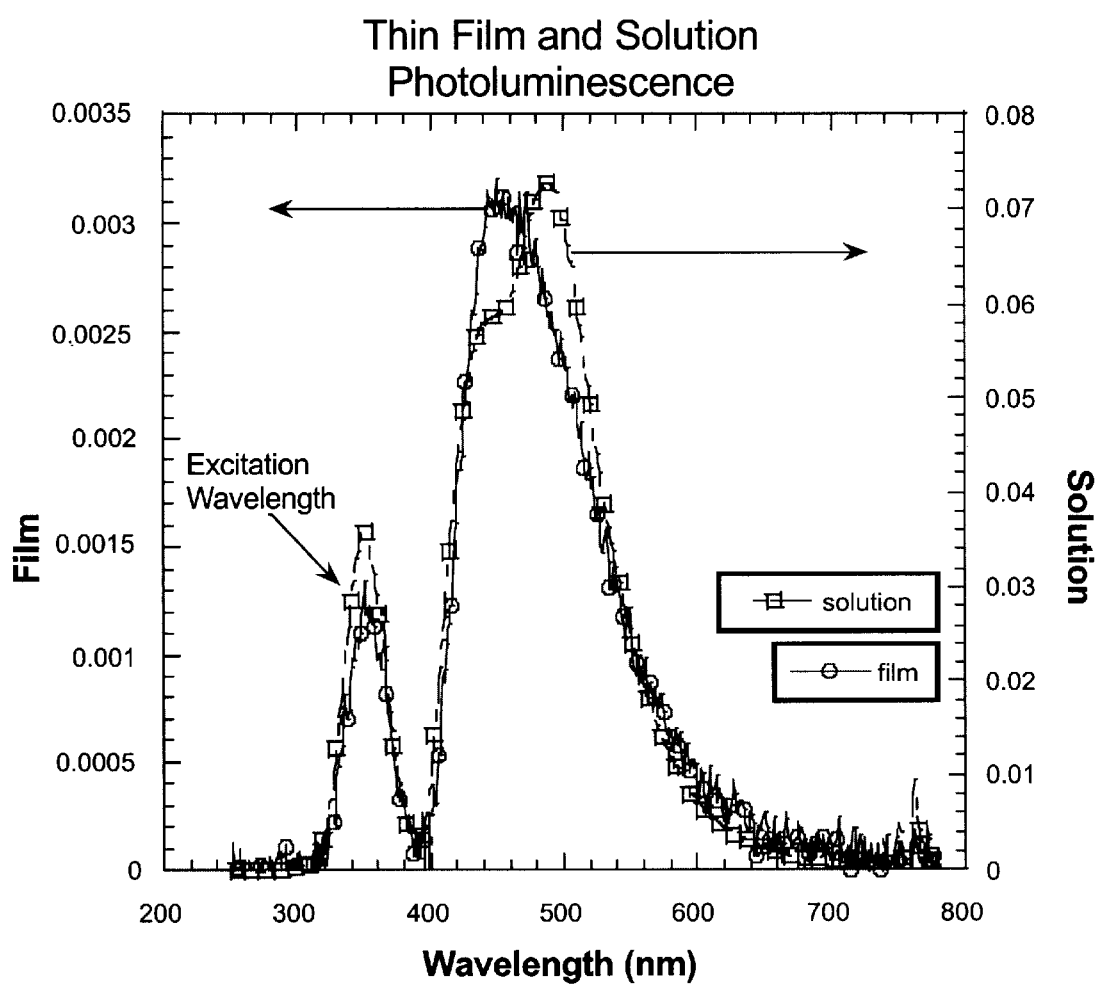
FIG. 3 is a graph of solution and thin film photoluminescence vs. wavelength for the hybrid material described in Example 2.

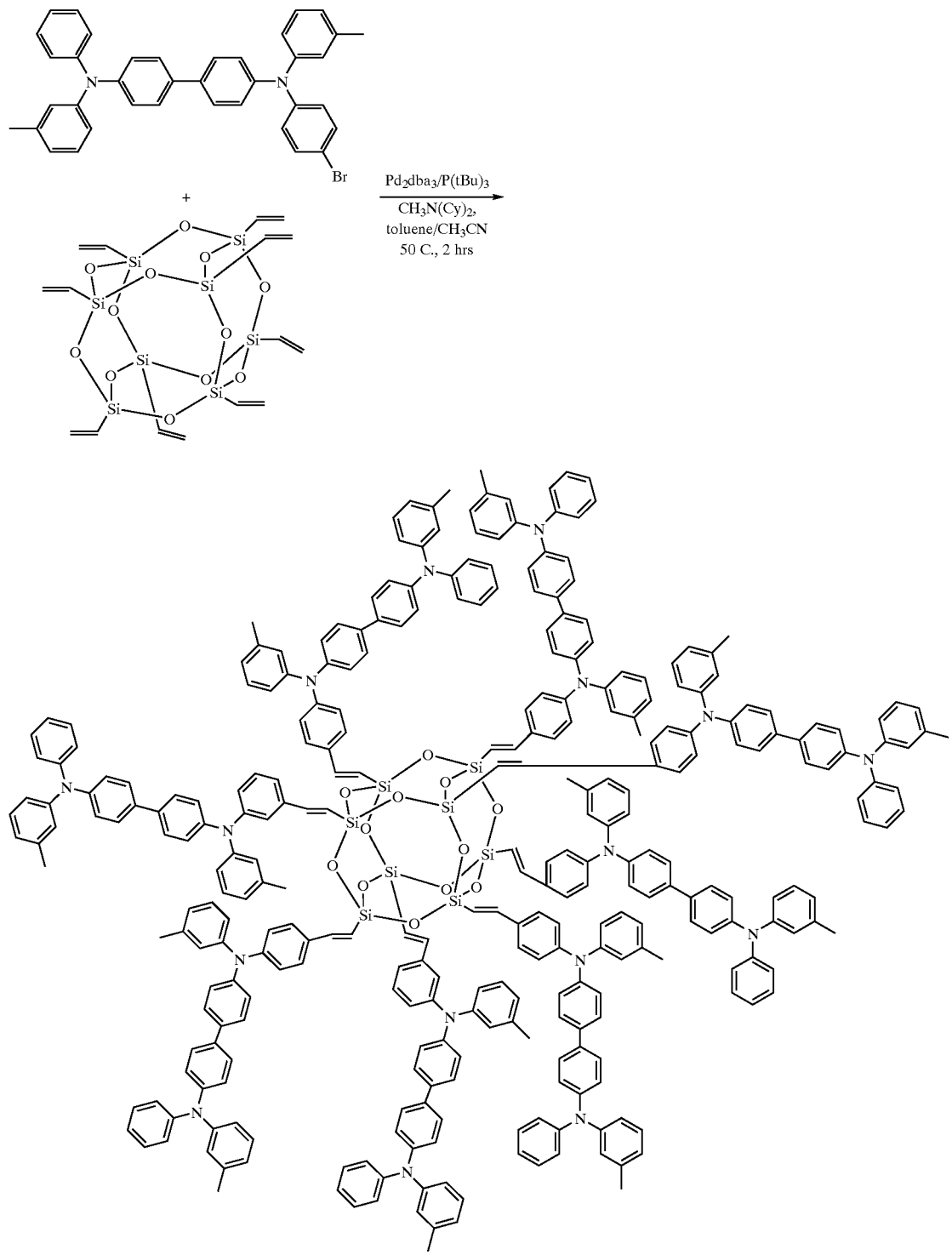

film are reported in FIG. 3. Size exclusion chromatography (SEC) revealed no starting material and a $M_n$=4920 g/mol (4750 g/mol actual), and polydispersity index (PDI) of 1.05. Proton NMR was consistent with the title material and differential scanning calorimetry (DSC) revealed a glass transition (Tg)=152° C. Thermal gravimetric analysis (TGA) in air gave a ceramic yield of 11.2% (theoretical ceramic yield=10.1%).

Figure 4:
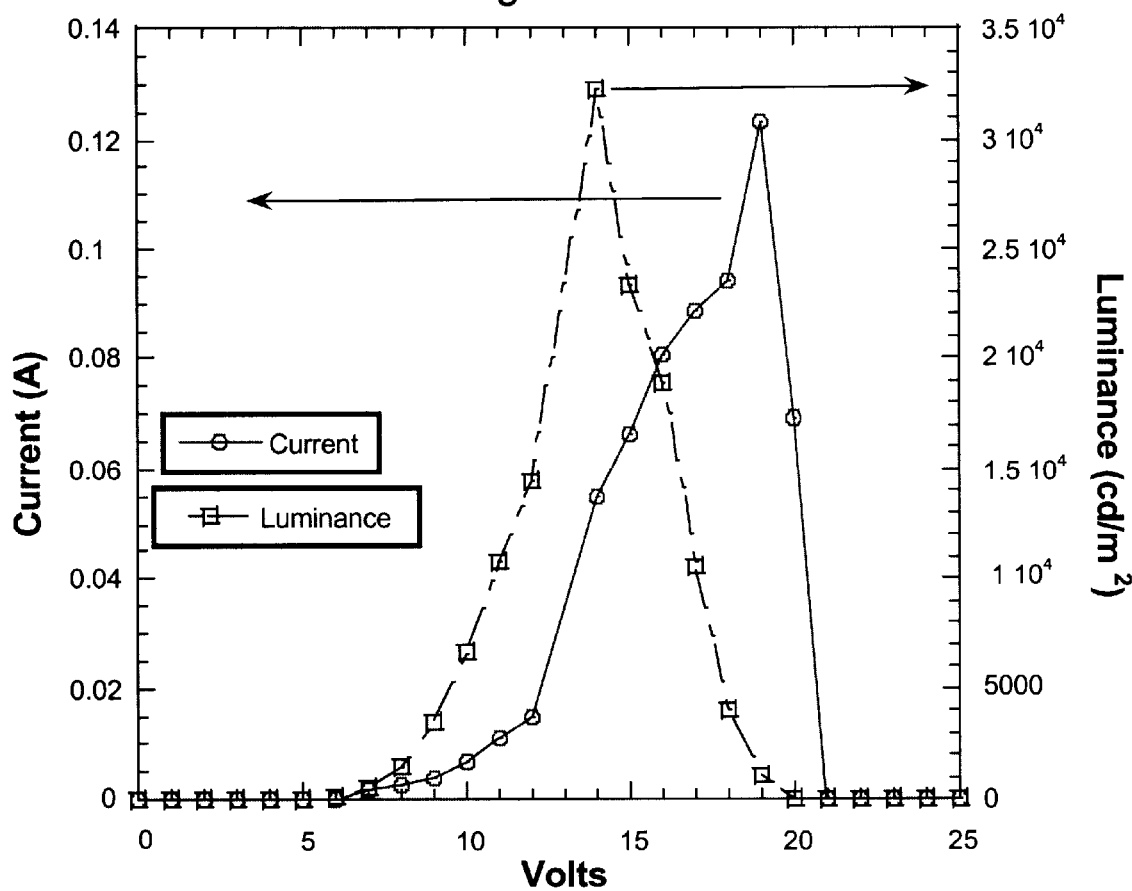
FIG. 4 is a graph of current (A) and luminance ($cd/m^2$) vs. voltage for a two-layer device fabricated with the inorganic-organic HLED material of Example 2.

The organic-inorganic HLED material prepared herein was fabricated into a two-layer device, such as that illustrated in FIG. 1. Referring to FIG. 1, the cathode layer 18 was an Al/Li (98.5/1.5) alloy, layer 14 was an emissive (EM) material tris(8-hydroxy-quinolinato)aluminum ($Alq_3$), layer 12 was the organic-inorganic HLED material prepared herein, anode layer 16 was indium tin oxide (ITO), and 22 was glass. FIG. 4 is a graph of current (A) and luminance ($cd/m^2$) vs. voltage for the fabricated device.

Example 3

Product from the reaction of octavinylsilsesquioxane with 9,9-di-n-butyl-2-bromofluorene.

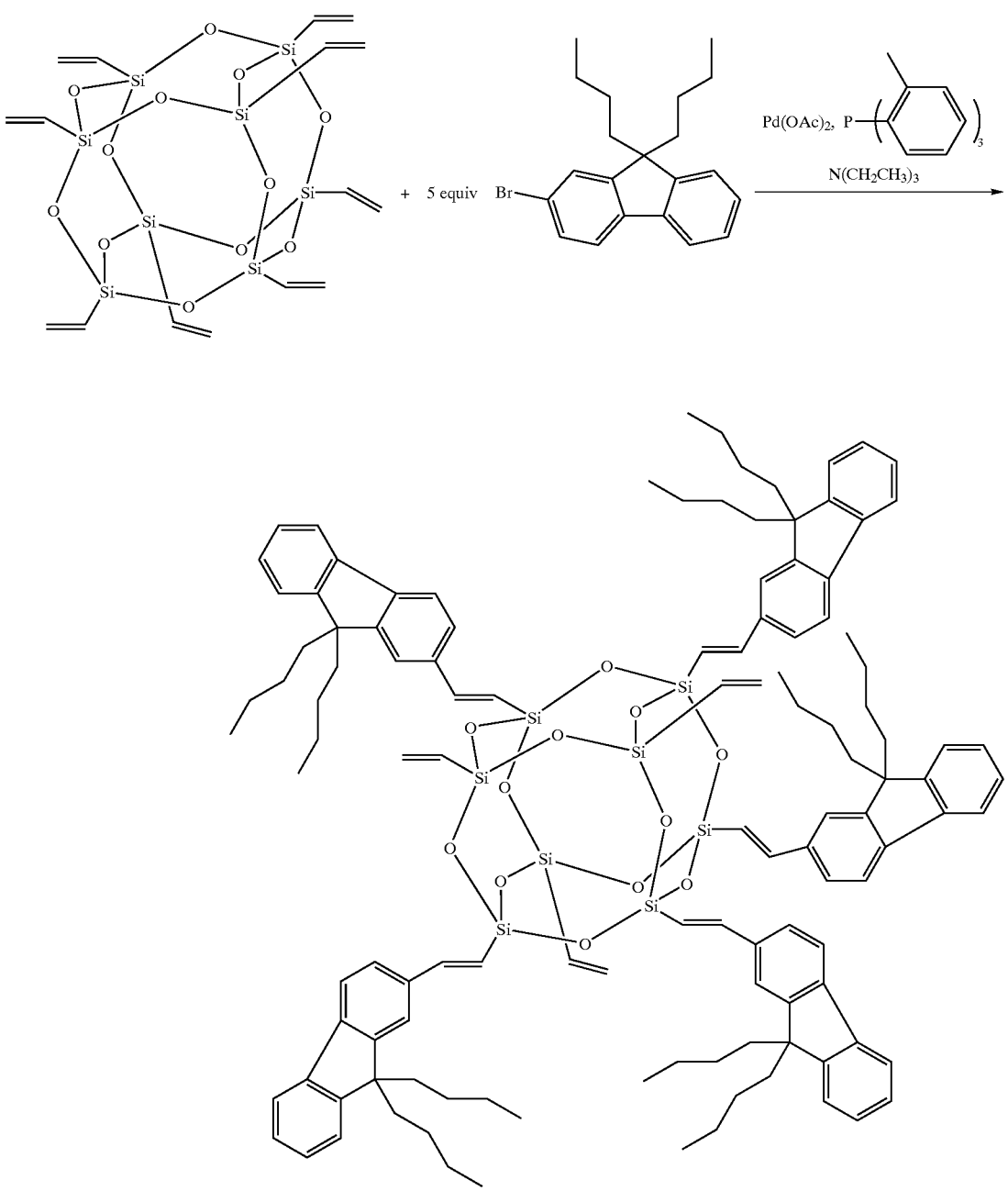

The product was prepared using the procedure from Example 1 to give a yellow solid in 91% yield. Size exclusion chromatography (SEC) revealed no starting material and a $M_n$=2825 g/mol (2015 g/mol actual), and polydispersity index (PDI) of 1.15. Proton NMR was consistent with the title material and differential scanning calorimetry (DSC) revealed a glass transition (Tg)=102° C. Thermal gravimetric analysis (TGA) in air gave a ceramic yield of 26% (theoretical ceramic yield=23%).

Example 5

Preparation of α-(bromo)-ω-(4-methoxyphenyl)-poly-2,7-(9,9-dioctylfluorene).

0.040 mmol) were added to a 50 mL schlenk tube in a glove box. The tube was transferred to a schlenk line, and 7 mL of dry toluene and 7 mL DMAc were added. The solution was stirred at room temperature for 2–24 hrs at 80° C. at which point excess 4-bromoanisole (1.2 mL) was added to endcap the polymer. The solution was further stirred for 8 hrs at 80° C. followed by precipitation in 200 mL methanol. The precipitate was dried, finely ground, and stirred with 5% HCl for 1 hour, filtered, rinsed with methanol and dried. The dried polymer was redissolved in minimal dichloromethane, and reprecipitated again in 200 mL methanol to afford 65% yield of dry polymer. A molecular weight of 4900 g/mol was determined by NMR endgroup analysis of the methoxy

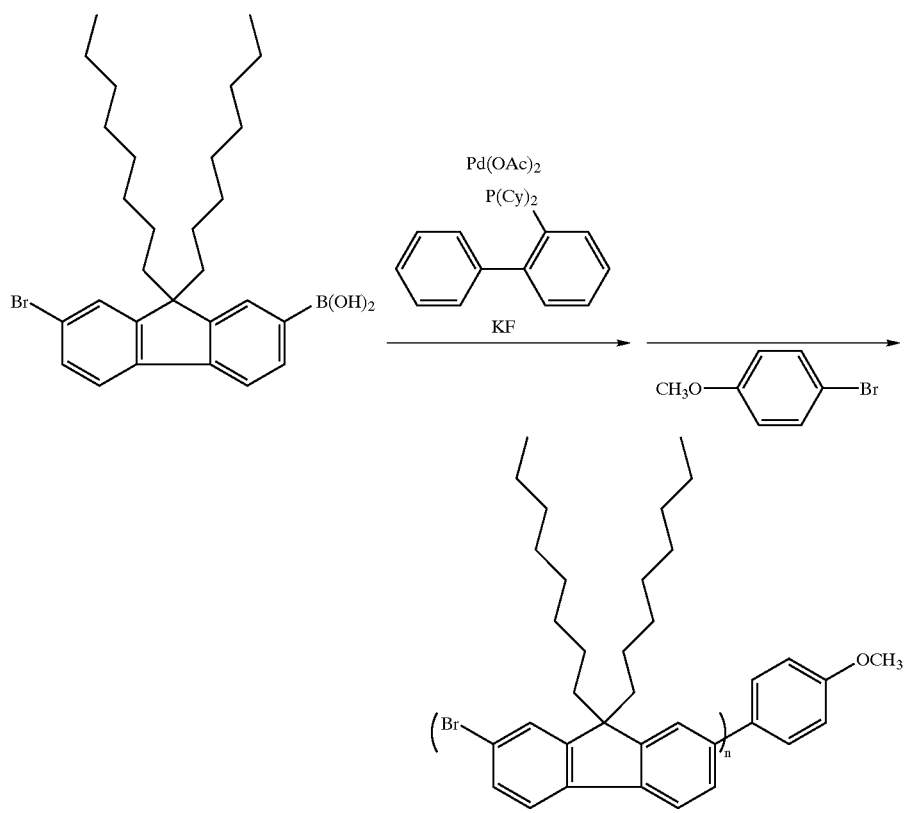

This monobrominated polymer was prepared according to a modified procedure to that described by Marsitzky et.al. (D. Marsitzky, M. Klapper, K. Mullen; Macromolecules, Vol. 32, No.25, 1999, 8685). 2-bromo-9,9-di-n-octylfluoreneboronic acid (1.0 g, 1.98 mmol), potassium fluoride (0.40 g, 6.93 mmol), palladium acetate (0.004 g, 0.020 mmol), 2-dicyclohexylphosphanyl-biphenyl (0.014 g, protons. GPC shows MW of 1200–6000 g/mol with PDI of 1.20–1.50 depending on the reaction time.

Example 6

Preparation of a polyfluorene star polymer with a central silsesquioxane core.

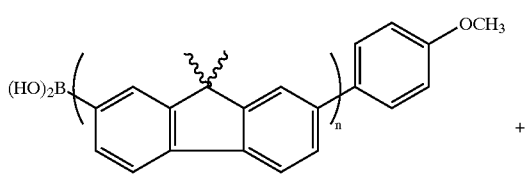

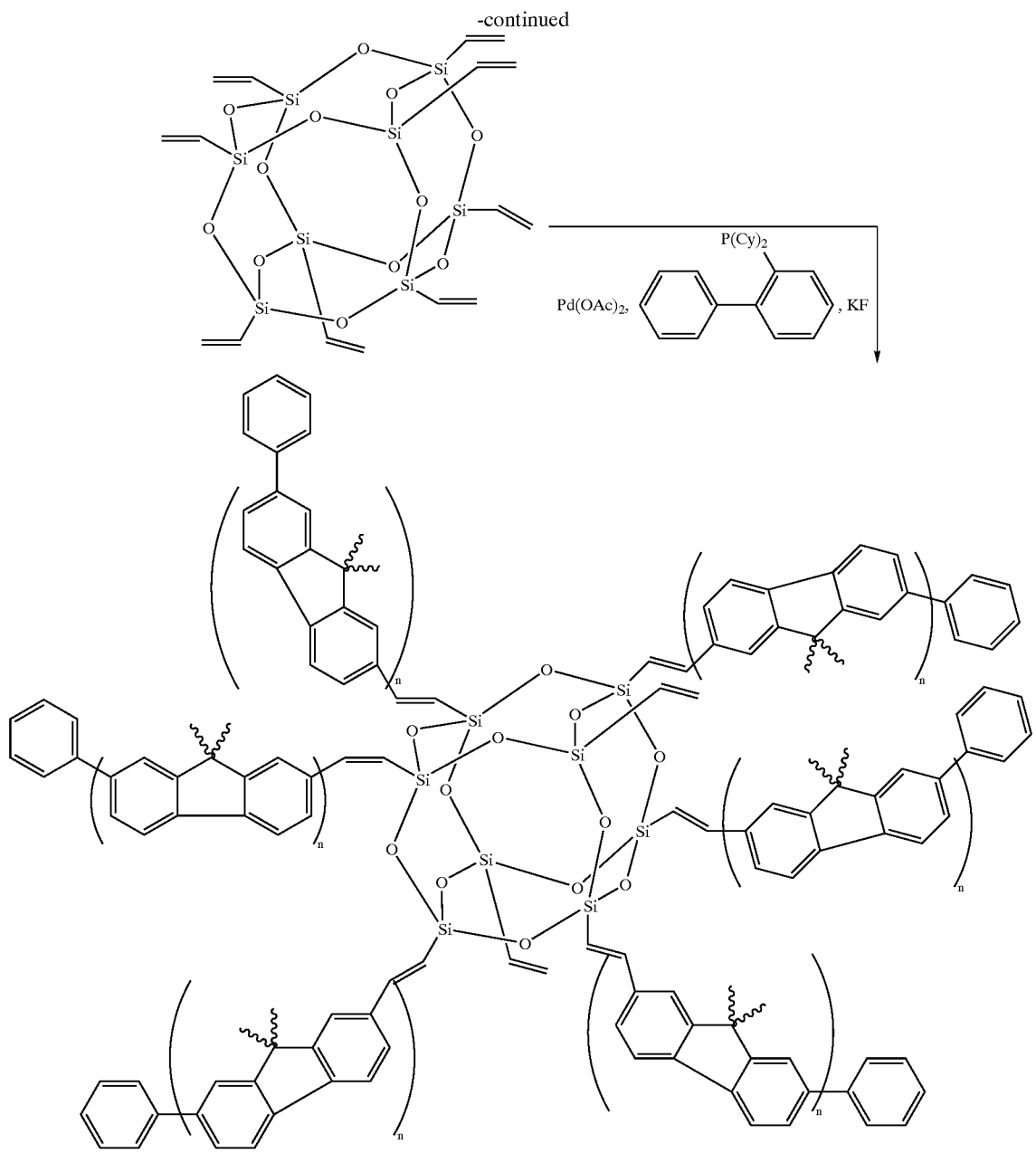

α-(bromo)-ω-(4-methoxyphenyl)-poly-2,7-(9,9-dioctylfluorene) from Example 5 (1 g, 0.20 mmol), octavinylsilsesquioxane (0.025 g, $3.92 \times 10^{-5}$ mol), palladium acetate (0.002 g, 0.01 mmol), and tris(o-tolyl)phosphine (0.007 g, 0.02 mmol) were added to a 25 mL schlenk flask equipped with stir bar, condenser, vacuum and argon gas source. The contents of the flask were evacuated and refilled with argon three times. Dry toluene (10 mL) and dry acetonitrile (or THF, dioxane) (2 mL) were added followed by triethylamine (0.035 mL, 0.25 mmol) and the solution was stirred for 48 hours at 100° C. The solution was cooled to room temperature and poured into cold methanol (20 mL) to precipitate a yellow solid. The solid is isolated by filtration, redissolved in dichloromethane (2 mL) and reprecipitated in methanol. GPC results are consistent with the anticipated structure. Alternatively palladium dibenzylideneacetone [Pd$_2$(dba)$_3$], tri-t-butylphosphine and N,N-dicyclohexylmethylamine may be used in place of palladium acetate, tris(o-tolyl)phosphine and triethylamine respectively. The former reagents allow for more mild reaction conditions, i.e. 50° C. rather than 100° C.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. An organic-inorganic HLED material comprising a polyhedral silsesquioxane structure having the following general structure:

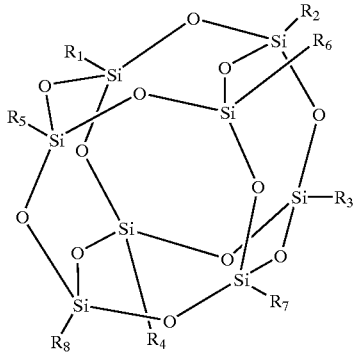

wherein $R_1$, $R_2$, $R_3$, $R_4$, $R_5$, $R_6$, $R_7$, and $R_8$ may be the same or different, and wherein at least one of $R_1$, $R_2$, $R_3$, $R_4$, $R_5$, $R_6$, $R_7$, and $R_8$ is a hole transport moiety, electron transport moiety, or emissive material moiety.

2. An organic-inorganic HLED material according to claim 1, wherein the silsesquioxane structure comprises a plurality of functional moiety substituents selected from hole transport, electron transport, and emissive material moieties.

3. An organic-inorganic HLED material according to claim 1, wherein the silsesquioxane structure comprises a plurality of different functional moiety substituents selected from hole transport, electron transport, and emissive material moieties.

4. An organic-inorganic HLED material according to claim 3, wherein the functional moiety substituents include at least one emissive material moiety and at least one other functional moiety selected from hole transport and electron transport moieties.

5. An organic-inorganic HLED material according to claim 1, wherein the electron transport moiety is selected from aromatic pyridines, quinolines, triazoles, oxadiazoles, dicyanoimidazoles, triazines, cyano aromatics, imino aromatics, or mixtures thereof.

6. An organic-inorganic HLED material according to claim 1, wherein the hole transport moiety is selected from aromatic phosphines, aromatic amines, thiophenes, silanes, or mixtures thereof.

7. An organic-inorganic HLED material according to claim 1, wherein at least one of $R_1$, $R_2$, $R_3$, $R_4$, $R_5$, $R_6$, $R_7$, and $R_8$ is selected from solubilizing and curable groups.

8. An organic-inorganic HLED material according to claim 7, wherein the solubilizing group is selected from fluoroalkanes and flourosilylalkanes.

9. An organic-inorganic HLED material according to claim 7, wherein the curable group is selected from epoxy, methacrylate, stryl, vinyl, propargyl and combinations thereof.

10. An organic-inorganic HLED material according to claim 1, wherein at least one of $R_1$, $R_2$, $R_3$, $R_4$, $R_5$, $R_6$, $R_7$, and $R_8$ is selected from hydrogen, vinyl, phenyl, substituted phenyl, vinyl phenyl, and substituted vinyl phenyl, where the phenyl substituents include, halo, amino, hydroxyl vinyl, vinyl, unsaturated alkyl, and halo alkyl.

11. An organic-inorganic HLED material according to claim 1, wherein $R_1$, $R_2$, $R_3$, $R_4$, $R_5$, $R_6$, $R_7$, and $R_8$ are

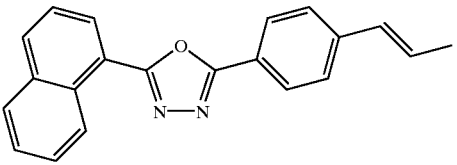

12. An organic-inorganic HLED material according to claim 1, wherein $R_1$, $R_2$, $R_3$, $R_4$, $R_5$, $R_6$, $R_7$, and $R_8$ are

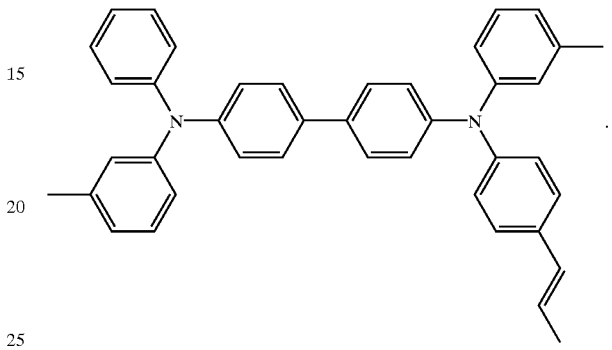

13. An organic-inorganic HLED material according to claim 1, wherein $R_1$, $R_2$, $R_3$, $R_4$, $R_5$, $R_6$, $R_7$, and $R_8$ are

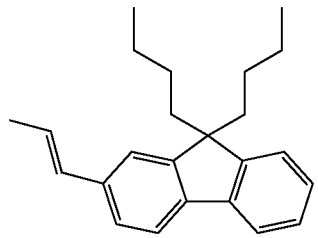

14. An organic-inorganic HLED material according to claim 1, wherein $R_1$, $R_2$, $R_3$, $R_4$, $R_5$, $R_6$, $R_7$, and $R_8$ are

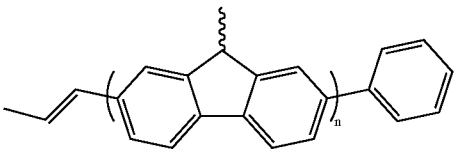

15. An organic-inorganic HLED material having the general formula $(RSiO_{1.5})_n$ wherein n ranges from 6 to 100, wherein R may be the same or different, and wherein at least one R substituent is a hole transport, electron transport, or emissive material moiety.

16. An organic-inorganic HLED material according to claim 15, wherein n ranges from 6 to 12.

17. An organic-inorganic HLED material according to claim 15, wherein at least one R substituent is a curable moiety.

18. An organic-inorganic HLED material according to claim 17, wherein the curable moiety is selected from epoxy, methacrylate, stryl, vinyl, propargyl and combinations thereof.

19. An organic-inorganic HLED material according to claim 15, wherein at least one R substituent is a solubilizing moiety.

20. An organic-inorganic HLED material according to claim 19, wherein the solubilizing moiety is selected from fluoroalkanes and flourosilylalkanes.

21. An organic-inorganic HLED device comprising:
an anode containing a high work function metal or metal alloy;
a cathode containing a low work function metal or metal alloy;
a layer of organic-inorganic luminescent material comprising a silsesquioxane structure having the following general structure:

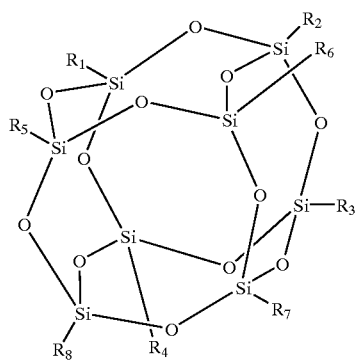

wherein $R_1$, $R_2$, $R_3$, $R_4$, $R_5$, $R_6$, $R_7$, and $R_8$ may be the same or different, and wherein at least one of $R_1$, $R_2$, $R_3$, $R_4$, $R_5$, $R_6$, $R_7$, and $R_8$ is a hole transport moiety, electron transport moiety, or emissive material moiety, said luminescent material being electrically connected to the anode and cathode.

22. An organic-inorganic HLED device according to claim 21, further comprising a transparent substrate upon which the device is fabricated.

23. An organic-inorganic HLED device according to claim 21, wherein the anode is selected from gold, silver, copper, fluorine-tin oxide (FTO), and indium-tin oxide (ITO).

24. An organic-inorganic HLED device according to claim 21, wherein the anode is selected from poly(aniline) (PANI) and poly(2,3-ethylenedioxy)thiophene (PEDOT).

25. An organic-inorganic HLED device according to claim 21, wherein the cathode is selected from calcium, magnesium, lithium, sodium, aluminum, and alloys thereof.

26. An organic-inorganic HLED device according to claim 21, wherein the cathode is a mixture of (i) calcium, magnesium, lithium, sodium, or aluminum with (ii) a halogen salt of an alkaline earth metal.

27. An organic-inorganic HLED device according to claim 21, further comprising one or more additional layers of organic-inorganic luminescent material.

28. An organic-inorganic HLED device according to claim 21, wherein the organic-inorganic luminescent material comprises a plurality of different functional moiety substituents selected from hole transport, electron transport, and emissive material moieties.

29. An organic-inorganic HLED device according to claim 21, wherein the HLED device comprises a single layer of the organic-inorganic luminescent material and wherein the luminescent material contains hole transport, electron transport, and emissive material substituent moieties.

30. An organic-inorganic HLED device according to claim 21, wherein the HLED device comprises a layer of the organic-inorganic luminescent material having an emissive material substituent and a layer of the organic-inorganic luminescent material having an electron transport substituent.

31. An organic-inorganic HLED device according to claim 21, wherein the HLED device comprises a layer of the organic-inorganic luminescent material having an emissive material substituent and a layer of the organic-inorganic luminescent material having a hole transport substituent.

32. An organic-inorganic HLED device according to claim 21, wherein the electron transport moiety is selected from aromatic pyridines, quinolines, triazoles, oxadiazoles, dicyanoimidazoles, triazines, cyano aromatics, imino aromatics, or mixtures thereof.

33. An organic-inorganic HLED device according to claim 21, wherein, the hole transport moiety is selected from aromatic phosphines, aromatic amines, thiophenes, silanes, or mixtures thereof.

34. An organic-inorganic HLED device according to claim 21, wherein $R_1$, $R_2$, $R_3$, $R_4$, $R_5$, $R_6$, $R_7$, and $R_8$ are

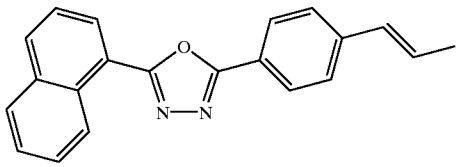

35. An organic-inorganic HLED device according to claim 21, wherein $R_1$, $R_2$, $R_3$, $R_4$, $R_5$, $R_6$, $R_7$, and $R_8$ are

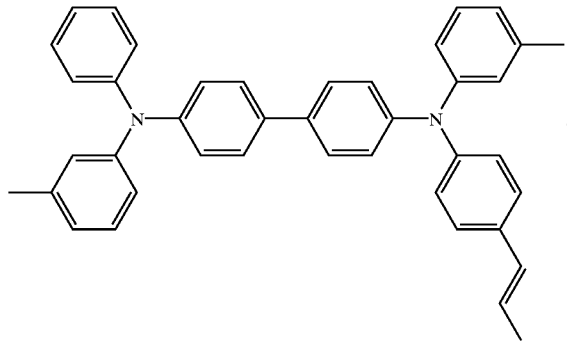

36. An organic-inorganic HLED device according to claim 21 wherein $R_1$, $R_2$, $R_3$, $R_4$, $R_5$, $R_6$, $R_7$, and $R_8$ are

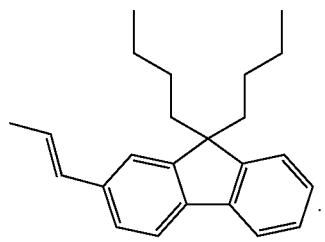

37. An organic-inorganic HLED device according to claim 21, wherein $R_1$, $R_2$, $R_3$, $R_4$, $R_5$, $R_6$, $R_7$, and $R_8$ are

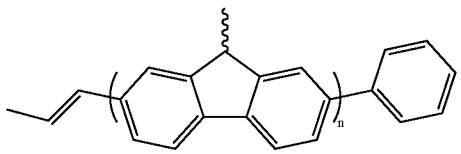

* * * * *

UNITED STATES PATENT AND TRADEMARK OFFICE
CERTIFICATE OF CORRECTION

PATENT NO. : 6,517,958 B1
DATED : February 11, 2003
INVENTOR(S) : Alan Sellinger et al.

It is certified that error appears in the above-identified patent and that said Letters Patent is hereby corrected as shown below:

Column 3,
Line 52, "$Cl^{\oplus}$" should read -- $Cl^{\ominus}$ --.

Column 5,
Line 14, "include," should read -- include --.

Column 18,
Line 10, "p-phenylenc" should read -- p-phenylene --; and
Line 40, "flourosilylalkanes" should read -- fluorosilylalkanes --.

Column 29,
Line 54, "flourosilylalkanes" should read -- fluorosilyalkanes --.
Line 62, "phenyl," should read -- phenyl, and --;
Line 63, ", vinyl phenyl, and substituted vinyl phenyl," should be deleted; and
Line 64, "include," should read -- include --.

Column 30,
Line 45, the chemical composition should read as follows:

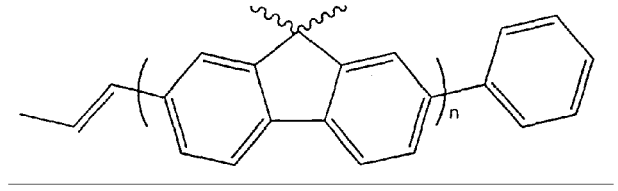

Line 51, "100," should read -- 100 --;
Line 52, "wherein R" should read -- and R --, and "and" should be deleted.

Column 31,
Line 3, "fluorosilyalkanes" should read -- fluorosilylalkanes --.

UNITED STATES PATENT AND TRADEMARK OFFICE
CERTIFICATE OF CORRECTION

PATENT NO. : 6,517,958 B1
DATED : February 11, 2003
INVENTOR(S) : Alan Sellinger et al.

It is certified that error appears in the above-identified patent and that said Letters Patent is hereby corrected as shown below:

Column 32,
Line 43, "claim 21" should read -- claim 21, --; and
Line 60, the chemical composition should read as follows:

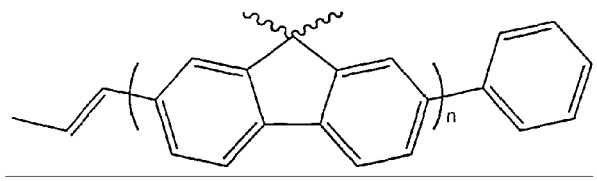

Signed and Sealed this

Fourteenth Day of September, 2004

JON W. DUDAS
*Director of the United States Patent and Trademark Office*